(12) United States Patent
Ueda et al.

(10) Patent No.: US 6,280,860 B1
(45) Date of Patent: Aug. 28, 2001

(54) ORGANIC ELECTROLUMINESCENT ELEMENT

(75) Inventors: Hideaki Ueda, Kishiwada; Yoshihisa Terasaka; Keiichi Furukawa, both of Suita, all of (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/162,050

(22) Filed: Sep. 28, 1998

(30) Foreign Application Priority Data

Sep. 29, 1997 (JP) .................................................. 9-264107

(51) Int. Cl.⁷ .............................. B32B 33/00; H01J 1/62
(52) U.S. Cl. .......................... 428/690; 428/212; 313/504; 313/506
(58) Field of Search .................................. 428/690, 917, 428/212; 313/504, 506

(56) References Cited

U.S. PATENT DOCUMENTS

| | | |
|---|---|---|
| 3,530,325 | 9/1970 | Mehl et al. . |
| 4,539,507 | 9/1985 | VanSlyke et al. . |
| 4,720,432 | 1/1988 | VanSlyke et al. . |
| 4,885,211 | 12/1989 | Tang et al. . |
| 5,047,687 * | 9/1991 | VanSlyke ............................ 313/503 |
| 5,059,862 * | 10/1991 | Van Slyke et al. .................. 313/503 |
| 5,458,977 * | 10/1995 | Hosokawa et al. ............... 428/411.1 |
| 5,776,622 * | 7/1998 | Hung et al. ........................... 428/690 |
| 5,925,980 * | 7/1999 | So et al. .............................. 313/504 |
| 6,023,073 * | 2/2000 | Strite .................................... 257/40 |
| 6,060,826 * | 5/2000 | Ueda et al. ........................... 313/498 |
| 6,064,151 * | 5/2000 | Choong et al. ...................... 313/504 |
| 6,137,223 * | 10/2000 | Hung et al. .......................... 313/506 |

FOREIGN PATENT DOCUMENTS

| | | |
|---|---|---|
| 03037994 | 2/1991 | (JP) . |
| 04132189 | 5/1992 | (JP) . |
| 04132191 | 5/1992 | (JP) . |
| 0435694 * | 12/1992 | (JP) . |
| 05121172 | 5/1993 | (JP) . |
| 07268317 | 10/1995 | (JP) . |

OTHER PUBLICATIONS

Hung, L.S., et al., "Enhanced electron injection in organic electroluminescence devices using an Al/LiF electrode," *Appl. Phys. Lett.* 70(2), Jan. 13, 1997, pp. 152–154.

* cited by examiner

Primary Examiner—Cynthia Harris Kelly
Assistant Examiner—Dawn L. Garrett
(74) Attorney, Agent, or Firm—Morrison & Foerster LLP

(57) ABSTRACT

The object of the invention is to provide an organic electroluminescent element which reduces the luminescence starting voltage, increases the luminescence brightness, and has excellent stability with repeated use.

The invention achieves these objects by providing an organic electroluminescent element comprising at least a positive electrode, luminescing layer, electron injecting layer, and negative electrode, wherein said electron injecting layer is a compound layer comprising an electron transporting material and metal, and the negative electrode side of said compound layer has a higher percentage of metal.

21 Claims, 2 Drawing Sheets

ORGANIC ELECTROLUMINESCENT ELEMENT

RELATED APPLICATIONS

This application is based on Application No. HEI 9-264107 filed in Japan, the content of which is hereby incorporated by reference.

BACKGROUND OF THE INVENTION

1. Field of the Invention

The present invention relates to an organic electroluminescent element.

2. Description of the Related Art

Organic electroluminescent elements are elements constructed using organic compounds as luminescent materials which emit light in response to electric signals.

Organic electroluminescent elements have a basic structure of an organic luminescent layer interposed between a pair of opposing electrodes.

Electroluminescence is a phenomenon wherein electrons are injected from one electrode and holes are injected from another electrode so as to excite an illuminant within the luminescent layer to a higher energy level, and excess energy is discharged as light when the illuminant returns to its original base state.

In addition to the aforesaid basic structure, a hole injecting layer is added to the electrode which injects holes and an electron transporting layer is added to the electrode injecting electrons so as to improve luminance efficiency.

An example of an organic electroluminescent element is disclosed in U.S. Pat. No. 3,530,325, which describes an electroluminescent element using a monocrystal anthracene as a luminant.

U.S. Pat. No. 4,539,507 discloses an organic electroluminescent element combining a hole injecting layer and an organic electroluminescent layer. U.S. Pat. No. 4,720,432 discloses an organic electroluminescent element combining an organic hole injecting layer and an organic electron injecting layer.

These electroluminescent elements with multi-layer structures comprise multiple layers of an organic fluorescent body, charge-transporting organic material (charge-transporting member), and electrodes, wherein luminescence is accomplished by holes and electrons injected by said respective electrodes moving through said charge-transporting member and again coupling. Examples of organic fluorescent bodies include organic colorants which fluoresce such as 8-quinolinol aluminum complex. Examples of charge-transporting materials include N,N'-di(m-tolyl)N,N'-diphenylbenzidene, diamino compounds such as 1,1-bis[N,N-di(p-tolyl)aminophenyl]cyclohexane and the like, and 4-(N,N-diphenyl)aminobenzaldehyde-N,N-diphenylhydrazone compounds and the like. Porphyrin compounds such as copper phthalocyanine have also been proposed.

Although organic electroluminescent elements have high luminance characteristics, they also are unstable when luminescing and have poor stability during storage so as to be impractical for use. One disadvantage of the aforesaid elements regarding storage stability and stability during luminescence pertains to the stability of the charge-transporting material. The layers of the electroluminescent element formed of organic material are quite thin at 100 to several hundred nanometers, and an extremely high voltage is applied to the layer per unit thickness. Heat is generated by luminescence and current flow, such that electrical, thermal, and chemical stability is required by the charge-transporting material.

Japanese Laid-Open Patent Nos. HEI 2-15595, 3-37994, 4-132191, and 5-121172 disclose elements which replace the conventionally used aluminum with a negative electrode to reduce the luminescence starting voltage of the organic electroluminescent element.

Japanese Laid-Open Patent Application Nos. HEI 4-1232189 and HEI 7-268317 disclose a layer combining a metal and an electron transporting material for use as an electron injection layer.

These elements do not attain satisfactory repeated cycle characteristics including luminescence starting voltage, luminescence intensity, and service life.

OBJECTS AND SUMMARY

In light of the aforesaid information, an object of the present invention is to provide an organic electroluminescent element which possesses increased luminescent intensity and exhibits stable characteristics even with repeated use.

The present invention relates to an organic electroluminescent element having at least a positive electrode, luminescent layer, electron injection layer, and negative electrode, wherein said electron injection layer is a mixture of metal and electron transporting material, and the percentage of metal is greater on the negative electrode side of said mixed layer.

BRIEF DESCRIPTION OF THE DRAWINGS

These and other objects and features of the present invention will become apparent from the following description of the preferred embodiments thereof taken in conjunction with the accompanying drawings, in which.

In the following description, like parts are designated by like reference numbers throughout the several drawings.

DETAILED DESCRIPTION OF THE PREFERRED EMBODIMENTS

Figure 1:
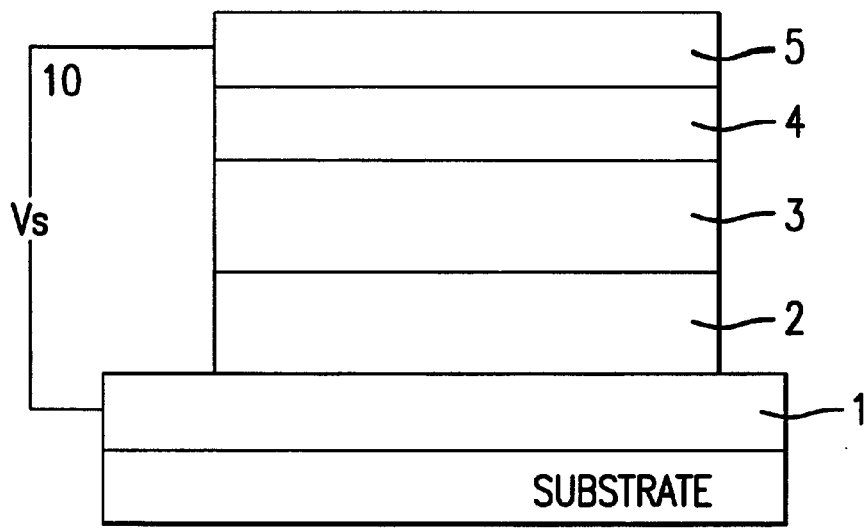
FIG. 1 is a brief section view showing an example of the structure of an organic electroluminescent element of the present invention.

The electroluminescent element of the present invention comprises at least a luminescing layer and an electron injecting layer interposed between electrodes. The present invention is basically characterized by a mixed layer of metal and electron injecting material used as an electron injecting layer, said mixed layer having different mixture ratios such that the ratio of metal is greater on the negative electrode side. The preferred embodiments are described hereinafter with reference to FIG. 1. FIG. 1 shows an example of the construction of an organic electroluminescent element adaptable to the present invention. In the drawing, reference number 1 refers to a positive electrode, over which are sequentially superimposed a hole injecting/transporting layer 2, organic luminescing layer 3, electron injecting layer 4, and negative electrode 5.

Materials having conductivity characteristics with a work function greater than 4 eV are useful as the positive electrode 1 of the organic electroluminescent element including, for example, carbon, aluminum, vanadium, iron, cobalt, nickel, copper, zinc, tungsten, silver, tin, gold and the like as well as alloys thereof, as well as conductive metal compounds such as tin oxide, indium oxide, antimony oxide, zinc oxide, zirconium oxide and the like.

Examples of useful metals for forming the negative electrode 5 include aluminum, silver and the like, as well as magnesium, calcium, titanium, yttrium, lithium, gadolinium, ytterbium, ruthenium, manganese and the like, and metals having higher work functions such as, for example, aluminum, indium, silver, gold, nickel, tin and the like as well as alloys thereof.

At least the positive electrode 1 or negative electrode 5 in the organic electroluminescent element must be a transparent electrode for the luminescence to be visible. In this instance, it is desirable that the positive electrode is transparent inasmuch as a negative electrode is subject to rapid loss of transparency.

When forming a transparent electrode, a conductive material such-as the aforesaid metals is deposited on a substrate via a means such as vacuum deposition, spattering or the like, or means for dispersing and applying a resin containing said conductive material, or sol-gel method, so as to maintain desired transparency and conductivity.

The material used for the transparent substrate is not specifically limited insofar as said substrate is not adversely affected by heat during vacuum deposition or during manufacture of the organic electroluminescent element, it is possible to use a glass substrate, or transparent resin such as, for example, polyethylene, polypropylene, polyethersulfone, polyether ether ketone and the like. Well-known commercial products such as ITO, NESA and the like used to form a transparent electrode on a glass substrate may also be used.

In FIG. 1, the hole injecting/transporting layer 2 formed on positive electrode 1 is desirably formed by vacuum deposition of a chemical compound, or said chemical compound being dissolved in solvent or fluid in which a suitable resin is dissolved, and applied by dip coating or spin coating.

When forming the hole injecting/transporting layer by vacuum deposition, the thickness of said layer is normally 1~200 nm, and desirably 5~100 nm; when said layer is formed by an application method, the thickness of said layer is about 5~500 nm. A thicker layer requires a higher application voltage to achieve luminescence, thereby adversely affecting luminous efficiency and causing deterioration of the organic electroluminescent element. Although luminous efficiency improves with a thinner layer, the layer readily breaks down and shortens the service life of the organic electroluminescent element.

Well-known material may be used as the hole injecting/transporting material in the hole injecting/transporting layer, for example, N,N'-diphenyl-N,N'-bis(3-methylphenyl)-1,1'-diphenyl-4,4'-diamine, N,N'-diphenyl-N,N'-bis(4-methylphenyl)-1,1'-diphenyl-4,4'-diamine, N,N'-diphenyl-N,N'-bis(1-naphthyl)-1,1'-diphenyl-4,4'-diamine, N,N'-diphenylN,N'-bis(2-naphthyl)-1,1'-diphenyl-4,4'-diamine, N,N'-tetra(4-methylphenyl)-1,1'-diphenyl-4,4'-diamine, N,N'-tetra(methylphenyl)-1,1'-bis(3-methylphenyl)-4,4'-diamine, N,N'-diphenyl-N,N'-bis(3-methylphenyl)-1,1'-bis(3-methylphenyl)-4,4'-diamine, N,N'-bis(N-carbazolyl)-1,1'-diphenyl-4,4'-diamine, 4,4',4"-tris(N-carbazolyl)triphenylamine, N,N',N"-triphenyl-N,N',N"-tris(3-methylphenyl)-1,3,5-tri(4-aminophenyl)benzene, 4,4',4"-tris([N,N',N"-triphenyl-N,N',N"-tris(3-methylphenyl)]triphenylamine and the like. These materials may be used in combinations of two or more.

Next, an organic luminescing layer 3 is formed over the hole injecting/transporting layer 2. Well-known organic luminants may be used for the organic luminescing layer 3, for example, 2,5-bis[5,7-di-t-pentyl-2-benzooxazolyl]thiophene, 2,2'-(1,4-phenylenedivenylene)bisbenzothiazole, 2,2'-(4,4'-biphenylene)bisbisbenzothiazole, 5-methyl-2-{2-[4-(5-methyl-2-benzooxazolyl)phenyl]vinyl}benzooxazole, 2,5-bis(5-methyl-2-benzooxazolyl)thiophene, anthracene, naphthalene, phenanthrene, pyrene, chrysene, perylene, perynone, 1,4-diphenylbutadiene, tetraphenylbutadiene, cumarin, acridine, stilbene, 2-(4-biphenyl)-6-phenylbenzooxazole, aluminum trisoxine, magnesium trisoxine, bis(benzo-8-quinolinole)zinc, bis(2-methyl-8-quinolinolaurate)aluminum oxide, indium trisoxine, aluminum tris(5-methyloxine), lithium oxine, galliumtrisoxine, calcium bis(5-chlorooxine), polyzinc-bis(8-hydroxy-5-quinolinolyl)methane, dilithium, zinc bisoxine, 1,2-phthaloperinone, 1,2-naphthaloperinone and the like.

Typical fluorescent dyes may also be used, including, for example, fluorescent cumarin dye, fluorescent perylene dye, fluorescent pyran dye, fluorescent thiopyran dye, fluorescent dye, fluorescent imidazole dye and the like. Among the aforesaid, chelated oxynoid compounds are particularly desirable.

The organic luminescing layer may have a monolayer structure of the aforesaid luminescent material, or may have a multi-layer structure to regulate characteristics such as color of luminescence, intensity of luminescence and the like. Two or more luminescing materials may be mixed, or the another luminescing material may be doped on the luminescing layer.

When forming the organic luminescing layer via vacuum deposition, the thickness of said layer is normally 1~200 nm, and desirably 1~100 nm, whereas when said layer is formed by an application method, the thickness of said layer may be 5~500 nm. A thicker layer requires a higher application voltage to achieve luminescence, thereby adversely affecting luminous efficiency and causing deterioration of the organic electroluminescent element. Although luminous efficiency improves with a thinner layer, the layer readily breaks down and shortens the service life of the organic electroluminescent element.

A mixed layer of metal and electron transporting material is formed over the organic luminescing layer 3 as the hole injecting layer 4. Examples of useful electron transporting materials for forming the electron injecting layer include nitro substituted fluorenone derivative, anthraquinodimethane derivative, diphenoquinone derivative, thiopyran dioxide derivative, oxadiazole derivative, triazole derivative, thiazoazole derivative, cumarin derivative chelated oxynoid compounds and the like. Among the aforesaid compounds, chelated oxynoid compounds are most desirable from the perspective of heat resistance. When the aforesaid organic luminescing material posses an electron transporting function, said organic luminescing material may be used as the electron transporting material in the electron injecting layer. In this instance, it is desirable that the same material is used in the luminescing layer. Examples of useful organic luminescing materials usable as the electron transporting material in the electron injecting layer include chelated oxynoid compounds such as aluminum trisoxine and the like.

The metal mixed in the electron injecting layer may possess a work function of less than 4 eV, such as magnesium, calcium, titanium, yttrium, lithium, gadolinium, ytterbium, ruthenium and the like. Particularly desirable from the perspective fluminescing characteristics and layer formability are magnesium, calcium, and lithium.

The electron injecting layer 4 is formed by vacuum deposition to a thickness of 1~3 nm, and desirably 5~20 nm. The applied voltage must be increased as the thickness of the layer increases, thereby adversely affecting luminescence efficiency and causing deterioration of the organic electroluminescent element. As the layer is made thinner, it becomes difficult to achieve a uniform layer thickness, such that defects readily occur which adversely affect luminescence efficiency and shortens the service life of the organic electroluminescent element.

The mixed layer comprising an electron transporting material and a metal having a smaller work function used as the electron injecting layer may be formed by normal resistance heating method, spattering, EB vacuum deposition, ion plating, ionization vacuum deposition and light well known methods.

In the present invention the aforesaid mixed layer has a mixture ratio which changes in the depth direction, so as to have a higher percentage of metal having a lower work function present on the negative electrode side. To obtain such a structure, the electron injecting layer comprises a plurality of layers such that the layers having a large percentage of metal having a low work function are nearest the interior side of the surface nearest the negative electrode. For example, when magnesium and aluminum trisoxine are used to form the electron injecting layer such that there is a slope of the structural ratio in a two layer structure, a layer having a magnesium:aluminumtrisoxine ratio, for example, of 1:1 is formed on the negative electrode side, and a layer having a magnesium:aluminumtrisoxine ratio, for example, of 1:5 is formed on the interior side (i.e., luminescing layer side). Similarly, when the electron injecting layer has a structure of three or more layers, a plurality of layers are superimposed one on another so as to have a higher percentage of metal on the layer nearest the surface side (negative electrode side). The overall thickness of the total thicknesses of said plurality of layers is set so as to be within the previously mentioned range. Other usable methods include gradually increasing the deposition rate of the metal, or gradually decreasing the deposition rate of the electron transporting material so as to consecutively change the structural ratio of the layer during formation. The ratio of metal mixed in the electron injecting layer is 5~200 percent by volume, and desirably 10~130 percent by volume so as to have a content within said range.

The negative electrode 5 is formed over the electron injecting layer 4. Negative electrode 5 is formed by normal resistance heating method, spattering method, EB vacuum deposition, ion plating, ionization vacuum deposition and like well known vacuum deposition methods, the thickness of said layer being 5~500 nm. As the thickness of this layer increases its resistance increase and somewhat higher voltage application is required, whereas as the layer is made thinner, it becomes difficult to achieve a uniform layer thickness, such that defects readily occur which adversely affect luminescence efficiency and shortens the service life of the organic electroluminescent element.

The pair of transparent electrodes comprising a positive electrode and negative electrode are connected to a suitable lead wire 10 of nickel-chrome wire, gold, wire, copper wire, platinum wire and the like, such that the organic electroluminescent element luminesces when suitable voltage Vs is applied to both electrodes via said lead wire.

Figure 2:
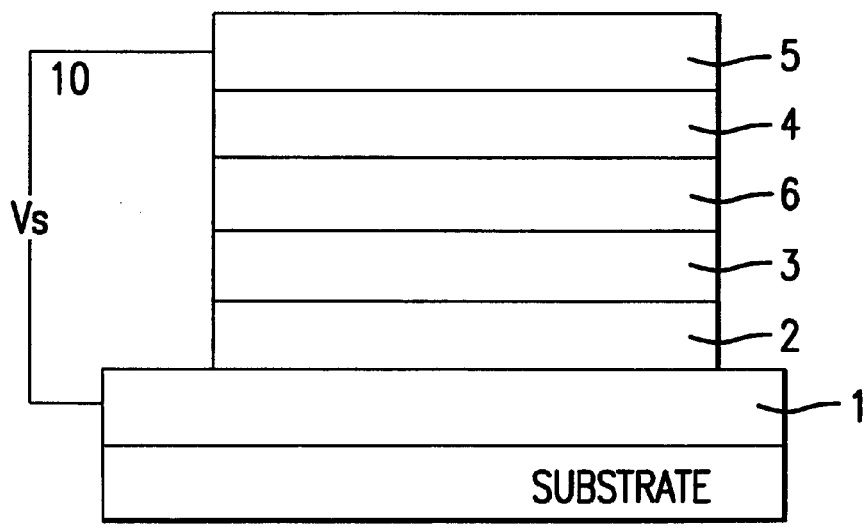
FIG. 2 is a brief section view showing an example of the structure of an organic electroluminescent element of the present invention.
Figure 3:
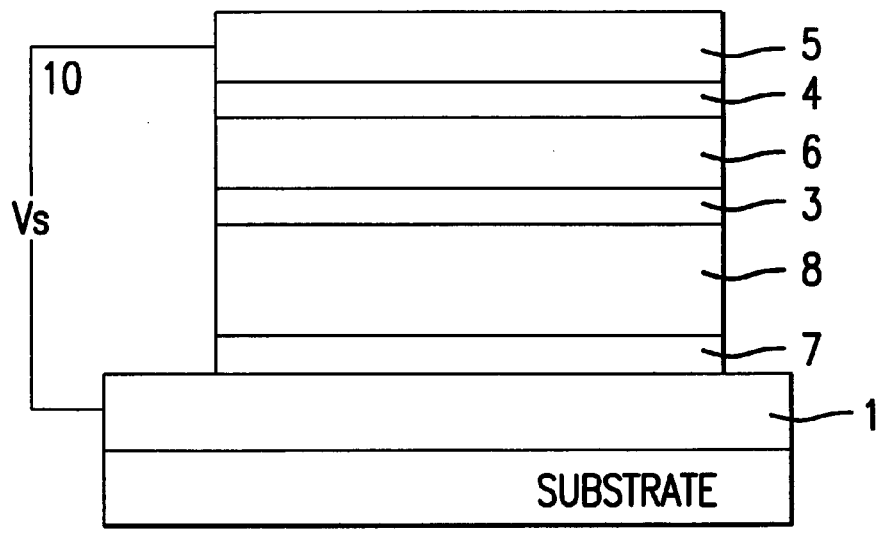
FIG. 3 is a brief section view showing an example of the structure of an organic electroluminescent element of the present invention.
Figure 4:
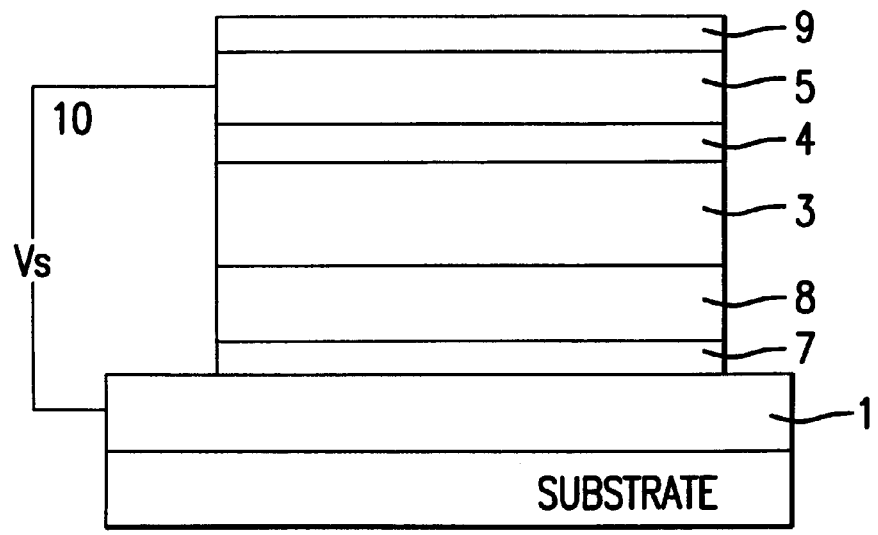
FIG. 4 is a brief section view showing an example of the structure of an organic electroluminescent element of the present invention.

Another construction of the organic electroluminescent element is shown in FIGS. 2~4. In FIG. 2, reference number 1 refers to a positive electrode over which are sequentially superimposed a hole injecting/transporting layer 2, organic luminescing layer 3, electron transporting layer 6, electron injecting layer 4, and negative electrode 4, said electron injecting layer being a mixed layer comprising a electron transporting material and metal.

In FIG. 3, reference number 1 refers to a positive electrode over which is sequentially superimposed a hole injecting layer 7, hole transporting layer 8, organic luminescing layer 3, electron transporting layer 6, electron injecting layer 4, and negative electrode 5, said electron injecting layer being a mixed layer comprising an electron transporting material and metal.

In FIG. 4, reference number 1 refers to a positive electrode over which is sequentially superimposed a hole injecting layer 7, hole transporting layer 8, organic luminescing layer 3, electron injecting layer 4, and negative electrode 5, and sealing layer 9, said electron injecting layer being a mixed layer comprising an electron transporting material and metal.

As shown in FIGS. 2 and 3, when an electron transporting layer 6 is interposed between the organic luminescing layer 3 and electron injecting layer 4, this layer will have a layer thickness of about 1~200 nm, and desirably 1~100 nm. The electron transporting material used in the electron transporting layer may be the same electron transporting material contained in the electron injecting layer. The electron transporting layer may be formed by conventional methods such as vacuum deposition and application methods in the same manner as the luminescing layer.

When the organic luminescing material possesses an electron transporting function and said organic luminescing material is used as the electron transporting material of the electron transporting layer, the same material may be used in the luminescing layer by doping the luminescing layer. For example, when the electron transporting layer is formed of aluminumtrisoxine, it is desirable that the luminescing layer is formed by doping the luminescing material with aluminumtrisoxine.

As shown in the organic electroluminescent elements of FIGS. 3 and 4, the hole injecting/transporting layer may be formed in a two-layer function-separated structure comprising a hole injecting layer 7 and hole transporting layer 8. The hole injecting layer 7 is formed of well known material, e.g., phthalocyanine compound, conductive high molecular weight compounds, arylamine compounds and the like, formed to a thickness of about 1~30 nm by a means such as vacuum deposition. The hole transporting layer 8 is formed of well known material, e.g., benzidene compounds, arylamine compound, styryl compound and the like formed to a layer thickness of about 10~200 nm by means such as vacuum deposition.

When the sealing layer 10 is formed as shown in FIG. 4, the sealing layer is formed using compounds such as silicone oxide, zinc oxide, manganese fluoride, magnesium oxide and the like to form a thin layer about 5~1,000 nm in thickness via vacuum deposition. The thickness of each of the aforesaid layers including the electron injecting layer may be measured using a quartz resonator type measuring device.

The present invention is believed to improve electron injectability by using a mixed layer comprising an electron transporting material and metal having a small work function as the electron injecting layer, and achieve extremely smooth electron flow in conjunction with electric field intensity by changing the mixture ratio of the materials in the depth direction so as to have a greater percentage f metal having a small work function on the negative electrode side (side opposite of the luminescing layer), thereby reducing the luminescence starting voltage required to induce luminescence of the organic electroluminescent element of the present invention, and making possible stable and long-term luminescence by preventing defects and black spots caused by oxidation from the negative electrode surface by increasing the work function of the negative electrode.

The organic electroluminescent element of the present embodiment is suitable for various types of display devices.

The present invention is described hereinafter by way of examples. The organic electroluminescent element of the present invention improves luminescence efficiency and luminescence intensity, as well as long service life of the element, and is not limited to the luminescent materials, luminescence enhancing materials, charge transporting materials, sensitizers, resins, electrode materials, or element manufacturing methods described in the following examples.

EXAMPLE 1

A thin hole injecting/transporting layer was formed on a glass substrate coated with indium-tin oxide via vacuum deposition using N,N'-diphenyl-N,N'-bis(3-methylphenyl)-1,1'-diphenyl-4,4'-diamine to form a layer 60 nm in thickness.

A thin layer of aluminum trisoxine 60 nm in thickness was superimposed over the aforesaid hole injecting/transporting layer via vacuum deposition to form an organic luminescing layer.

Then, lithium and aluminumtrisoxine were co-deposited by resistance heating with an initial volume ratio of 1:10 and the deposition rate of lithium was gradually increased until the final volume ratio was 1:1 to form a thin layer having an overall thickness of 20 nm to form an electron injecting layer.

Then, aluminum was vacuum deposited to a thickness of 200 nm to form the negative electrode.

The organic electroluminescent element was produced in this manner.

EXAMPLE 2

A thin hole injecting/transporting layer was formed on a glass substrate coated with indium-tin oxide via vacuum deposition using N,N'-diphenyl-N,N'-bis(3-methylphenyl)-1,1'-diphenyl-4,4'-diamine to form a layer 60 nm in thickness.

A thin layer of aluminum trisoxine 60 nm in thickness was superimposed over the aforesaid hole injecting/transporting layer via vacuum deposition to form an organic luminescing layer.

Then, lithium and aluminumtrisoxine were co-deposited via vacuum deposition at a volume ratio of 1:1 to form a thin layer 5 nm in thickness.

Then, lithium and aluminumtrisoxine were co-deposited via vacuum deposition at a volume ratio of 1:5 to form a thin layer 5 nm in thickness.

Next, aluminum was vacuum deposited to a thickness of 200 nm to form the negative electrode.

The organic electroluminescent element was produced in this manner.

EXAMPLE 3

A thin hole injecting/transporting layer was formed on a glass substrate coated with indium-tin oxide via vacuum deposition using N,N'-diphenyl-N,N'-bis(3-methylphenyl)-1,1'-diphenyl-4,4'-diamine to form a layer 60 nm in thickness.

A thin layer of aluminum trisoxine 60 nm in thickness was superimposed over the aforesaid hole injecting/transporting layer via vacuum deposition to form an organic luminescing layer.

Then, lithium and aluminumtrisoxine were co-deposited via resistance heating at a volume ratio of 1:3 to form a thin layer 60 nm in thickness to form an electron injecting layer.

Next, lithium and aluminumtrisoxine were co-deposited via resistance heating at a volume ratio of 5:4 to form a thin layer 10 nm in thickness.

Then, aluminum was vacuum deposited to a thickness of 200 nm to form the negative electrode.

The organic electroluminescent element was produced in this manner.

EXAMPLE 4

A thin hole injecting/transporting layer was formed on a glass substrate coated with indium-tin oxide via vacuum deposition using N,N'-diphenyl-N,N'-bis(3-methylphenyl)-1,1'-diphenyl-4,4'-diamine to form a layer 60 nm in thickness.

A thin layer of aluminum trisoxine 60 nm in thickness was superimposed over the aforesaid hole injecting/transporting layer via vacuum deposition to form an organic luminescing layer.

Then, magnesium and aluminumtrisoxine were co-deposited via resistance heating at a volume ratio of 1:3 to form a thin layer 5 nm in thickness to form an electron injecting layer.

Next, magnesium and aluminumtrisoxine were co-deposited via resistance heating at a volume ratio of 1:1 to form a thin layer 6 nm in thickness as an electron injecting layer.

Then, aluminum was vacuum deposited to a thickness of 200 nm to form the negative electrode.

The organic electroluminescent element was produced in this manner.

REFERENCE EXAMPLE 1

An organic electroluminescent element was prepared in the same manner as in Example 1 with the exception that the electron injecting layer was not provided.

REFERENCE EXAMPLE 2

An organic electroluminescent element was prepared in the same manner as in Example 1 with the exception that the electron injecting layer was formed by co-deposition of magnesium and aluminumtrisoxine via resistance heating at volume ratio of 1:2 to form a thin layer 10 nm in thickness. Thereafter the negative electrode was formed by deposition of aluminum to a thickness of 20 nm.

The organic electroluminescent element was produced in this manner.

EXAMPLE 5

A thin hole injecting/transporting layer was formed on a glass substrate coated with indium-tin oxide via vacuum deposition using N,N'-diphenyl-N,N'-bis(1-naphthyl)-1,1'-diphenyl-4,4'-diamine to form a layer 55 nm in thickness.

A thin layer of aluminum trisoxine doped with 5 wt % rubrene was co-deposited to a thickness of 10 nm to form an organic luminescing layer.

Then, aluminumtrisoxine was deposited to form a thin layer 45 nm in thickness as an electron transporting layer.

Next, magnesium and aluminumtrisoxine were co-deposited via resistance heating at an initial volume ratio of 1:5 with the magnesium deposition rate gradually increased to a final volume ratio of 1:1 to form a thin layer 20 nm in overall thickness as an electron injecting layer.

Then, aluminum was vacuum deposited to a thickness of 200 nm to form the negative electrode.

The organic electroluminescent element was produced in this manner.

REFERENCE EXAMPLE 3

An organic electroluminescent element was prepared in the same manner as in Example 5 with the exception that the electron injecting layer was not provided.

REFERENCE EXAMPLE 4

An organic electroluminescent element was prepared in the same manner as in Example 5 with the exception that magnesium and aluminumtrisoxine were co-deposited via resistance heating at a volume ratio of 1:3 to form the electron injecting layer.

Finally aluminum was deposited to a thickness of 200 nm as the negative electrode.

EXAMPLE 6

A thin hole injecting/transporting layer was formed on a glass substrate coated with indium-tin oxide via vacuum deposition using N,N'-diphenyl-N,N'-bis(1-naphthyl)-1,1'-diphenyl-4,4'-diamine to form a layer 55 nm in thickness.

A thin layer of aluminum trisoxine doped with 5 wt % rubrene was co-deposited to a thickness of 10 nm to form an organic luminescing layer.

Then, aluminumtrisoxine was deposited to form a thin layer 45 nm in thickness as an electron transporting layer.

Next, lithium and aluminumtrisoxine were co-deposited via resistance heating at an initial volume ratio of 1:2 to form a thin layer 10 nm in overall thickness as an electron injecting layer.

Next, lithium and aluminumtrisoxine were co-deposited via resistance heating at an initial volume ratio of 3:2 to form a thin layer 5 nm in overall thickness as an electron injecting layer.

Then, aluminum was vacuum deposited to a thickness of 200 nm to form the negative electrode.

The organic electroluminescent element was produced in this manner.

EXAMPLE 7

A thin hole injecting layer was formed on a glass substrate coated with indium-tin oxide via vacuum deposition using 4,4',4"-tris[N,N',N",-triphenyl-N,N',N"-tris(3-methylphenyl)]triphenylamine to form a layer 15 nm in thickness.

A thin layer of N,N'-diphenyl-N,N'-bis(4-methylphenyl)-1,1'-bis(3-methylphenyl)-4,4'-diamine was vacuum deposited over said hole injecting layer to form a hole transporting layer 45 nm in thickness.

A thin layer of aluminum trisoxine doped with 5 wt % rubrene was co-deposited to a thickness of 30 nm to form an organic luminescing layer.

Then, aluminumtrisoxine was deposited to form a thin layer 30 nm in thickness as an electron transporting layer.

Next, lithium and aluminumtrisoxine were sequentially co-deposited via resistance heating at an initial volume ratio of 1:3 and thickness of 5 nm, volume ratio of 1:2 and thickness of 5 nm, and volume ratio of 1:1 and thickness of 5 nm to form an electron injecting layer.

Finally, magnesium and silver were co-deposited at an atomic ratio of 10:1 to form a negative electrode 200 nm in thickness.

The organic electroluminescent element was produced in this manner.

REFERENCE EXAMPLE 5

An organic electroluminescent element was produced in the same manner as Example 7 with the exception that the electron injection layer was formed by co-depositing lithium and aluminumtrisoxine via resistance heating at a volume ratio of 1:2 to form a thin layer 15 nm in thickness.

Evaluations

The organic electroluminescent elements prepared in Examples 1~7 and Reference Examples 1~5 were evaluated by measuring the voltage V required to start luminescence when a DC voltage was gradually applied, luminance brightness (cd/m2) when a 5 V DC voltage was applied, and luminance brightness (cd/m2) when a 10 V DC voltage was applied.

The loss rate (%) of initial output when operated for 5 hr at a current density of 5 mA/cm2 was determined (i.e., [output after 5 hr (mW/cm2)/initial output (mW/cm2)× 100]).

Measurement results are shown in Table 1.

TABLE 1

|  | Luminescence Starting Voltage | Brightness at 5 V (cd/m2) | Brightness at 10 V (cd/m2) | Drop in initial output (%) |
|---|---|---|---|---|
| Ex. 1 | 2.8 | 84 | 15610 | 94 |
| Ex. 2 | 2.8 | 81 | 15240 | 95 |
| Ex. 3 | 2.8 | 90 | 17540 | 94 |
| Ex. 4 | 3.0 | 79 | 14730 | 94 |
| Ref Ex. 1 | 9.0 | 0 | 20 | 43 |
| Ref. Ex. 2 | 3.5 | 40 | 5250 | 83 |
| Ex. 5 | 3.0 | 70 | 12560 | 93 |
| Ref Ex. 3 | 9.0 | 0 | 32 | 47 |
| Ref Ex. 4 | 3.6 | 29 | 3360 | 82 |
| Ex. 6 | 2.8 | 85 | 16940 | 94 |
| Ex. 7 | 2.7 | 90 | 18170 | 95 |
| Ref Ex. 5 | 3.3 | 57 | 8725 | 88 |

As can be understood from Table 1, the organic electroluminescent element of the present invention starts luminescing at a low potential and exhibit excellent luminance brightness.

The organic electroluminescent element of the present invention exhibits only slight output reduction, and stable luminance over a long period was observed.

The organic electroluminescent element of the present invention achieves superior luminance efficiency and luminance brightness, and achieves long term serviceability, and is not restricted as to luminescent material, luminescence-enhancing material, charge-transporting material, sensitizers, resins, positive electrode materials, nor in the method of manufacturing the element.

The present invention provides an organic electroluminescent element which increases luminance intensity, and excellent durability by reducing the luminance starting voltage by including an electron transporting material and metal in the electron injecting layer of the organic electroluminescent element such that the percentage of metal is greater on the negative electrode side .

Although the present invention has been fully described by way of examples with reference to the accompanying drawings, it is to be noted that various changes and modification will be apparent to those skilled in the art. Therefore, unless otherwise such changes and modifications depart from the scope of the present invention, they should be construed as being included therein.

What is claimed is:

1. An organic electroluminescent element comprising:

a positive electrode;

a luminescing layer;

an electron injecting layer; and a negative electrode;

wherein said electron injecting layer is interposed between the luminescing layer and the negative electrode and is composed of an electron transporting material and a metal, said electron injecting layer having a higher concentration of the metal in a negative electrode side of the electron injecting layer than that in a luminescing layer side of the electron injecting layer, said metal having a work function of less than 4.0 eV and being at least one type selected from the group consisting of magnesium, calcium, titanium, yttrium, lithium, gadolinium, ytterbium and ruthenium.

2. The organic electroluminescent element claimed in claim 1, wherein the thickness of said electron injecting layer is 1 to 30 nm.

3. The organic electroluminescent element claimed in claim 2, wherein the thickness of said electron injecting layer is 5 to 20 nm.

4. The organic electroluminescent element claimed in claim 1, wherein said metal is at least one type selected from the group consisting of magnesium, calcium and lithium.

5. The organic electroluminescent element claimed in claim 1, wherein said electron injecting layer is formed by co-deposition of the metal and the electron transporting material.

6. The organic electroluminescent element claimed in claim 1, wherein said electron injecting layer includes a layer having a high percentage of metal and a layer having a low percentage of metal.

7. The organic electroluminescent element claimed in claim 1, wherein said electron injecting layer includes three or more layers, each having a different metal concentration.

8. The organic electroluminescent element claimed in claim 1, wherein the metal concentration of said electron injecting layer gradually increases from the luminescing layer side to the negative electrode side.

9. The organic electroluminescent element claimed in claim 1, wherein the metal content is 5 to 200 percent by volume relative to the electron transporting material.

10. The organic electroluminescent element claimed in claim 1, wherein said electron transporting material is an organic compound.

11. The organic electroluminescent element claimed in claim 10, wherein said electron transporting material is a chelated oxynoid compound.

12. The organic electroluminescent element claimed in claim 1, further comprising an electron transporting layer which is interposed between said electron injecting layer and said luminescing layer.

13. The organic electroluminescent element claimed in claim 1, wherein said negative electrode is formed of material containing aluminum or silver.

14. The organic electroluminescent element claimed in claim 1, wherein the thickness of said negative electrode is 5 to 500 nm.

15. The organic electroluminescent element claimed in claim 1, further comprising a sealing layer provided on the exterior surface of said negative electrode.

16. The organic electroluminescent element claimed in claim 1, further comprising a hole injecting/transporting layer which is interposed between said positive electrode and said luminescing layer.

17. The organic electroluminescent element claimed in claim 1, further comprising a hole injecting layer and a hole transporting layer, the hole injecting layer interposed between said positive electrode and the hole transporting layer.

18. The organic electroluminescent element claimed in claim 1, wherein said electron injecting layer and said luminescing layer contain identical electron transporting material.

19. An organic electroluminescent element comprising:

a positive electrode;

a luminescing layer;

an electron injecting layer; and a negative electrode;

wherein said electron injecting layer is interposed between the luminescing layer and the negative electrode and is composed of an electron transporting material and a metal, said electron injecting layer having a higher concentration of the metal in a negative electrode side of the electron injecting layer than that in a luminescing layer side of the electron injecting layer, a volume ratio of metal/electron transporting material in the luminescing layer side of the electron injecting layer being more than 1/5.

20. The organic electroluminescent element claimed in claim 19, wherein said volume ratio of metal/electron transporting material is more than 1/3.

21. The organic electroluminescent element claimed in claim 19, wherein a volume ratio of metal/electron transporting material in the negative electrode side of the electron injecting layer is less than 3/2.

* * * * *